(12) United States Patent
Ye et al.

(10) Patent No.: US 10,978,621 B2
(45) Date of Patent: Apr. 13, 2021

(54) LIGHT EMITTING ELEMENT, LIGHT EMITTING ASSEMBLY, DISPLAY DEVICE, AND METHOD FOR MAKING A LIGHT EMITTING ASSEMBLY

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventors: Syun-Long Ye, Zhunan (TW); Wen-Hsiao Huang, Zhunan (TW); Ta-Jen Huang, Zhunan (TW)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 17 days.

(21) Appl. No.: 16/531,286

(22) Filed: Aug. 5, 2019

(65) Prior Publication Data
US 2020/0343418 A1   Oct. 29, 2020

(30) Foreign Application Priority Data
Apr. 24, 2019   (CN) .......................... 201910333207.3

(51) Int. Cl.
*H01L 33/50* (2010.01)
*H01L 33/58* (2010.01)
(Continued)

(52) U.S. Cl.
CPC ........ *H01L 33/504* (2013.01); *H01L 25/0753* (2013.01); *H01L 33/505* (2013.01); *H01L 33/508* (2013.01); *H01L 33/52* (2013.01); *H01L 33/58* (2013.01); *H01L 33/62* (2013.01); *H01L 2933/005* (2013.01);
(Continued)

(58) Field of Classification Search
CPC . H01L 25/0753; H01L 33/504; H01L 33/505; H01L 33/508; H01L 33/52; H01L 33/56; H01L 33/58; H01L 33/62; H01L 2933/0041; H01L 2933/005;
(Continued)

(56) References Cited

U.S. PATENT DOCUMENTS

| | | | | |
|---|---|---|---|---|
| 2011/0309390 | A1* | 12/2011 | Liu | ...................... H01L 25/0753 257/89 |
| 2012/0267657 | A1* | 10/2012 | Ng | ........................ H01L 33/504 257/98 |
| 2012/0267997 | A1* | 10/2012 | Kijima | ............... C09K 11/7739 313/498 |

* cited by examiner

*Primary Examiner* — Allan R Wilson
(74) *Attorney, Agent, or Firm* — ScienBiziP, P.C.

(57) ABSTRACT

A light emitting element, used behind a display, comprises LED chips emitting blue light and separated red and green phosphor layers on the LED chip, the layers receiving the emitted blue light and respectively converting the same into precise colors for the display. A portion of the light directly from the LED chip is also combined with the converted light and passed on as lighting for the display. Partial absorption of green light by the red phosphor and red light by the green phosphor, occurring when the red and green phosphor layers are overlapped, is avoided. Light conversion efficiency of the green and red phosphor layers is thereby improved. A light emitting assembly, a display device, and a method for making the light emitting assembly are also disclosed.

15 Claims, 7 Drawing Sheets

(51) Int. Cl.
  *H01L 25/075* (2006.01)
  *H01L 33/62* (2010.01)
  *H01L 33/52* (2010.01)
(52) U.S. Cl.
  CPC ............... *H01L 2933/0041* (2013.01); *H01L 2933/0058* (2013.01); *H01L 2933/0066* (2013.01)
(58) Field of Classification Search
  CPC ..... H01L 2933/0058; H01L 2933/0066; H01L 2933/0091
  See application file for complete search history.

Block S11

FIG. 4A

Block S12

FIG. 4B

Block S21

FIG. 5A

Block S22

FIG. 5B

Block S23

Block S32

FIG. 7A

Block S33

FIG. 7B

LIGHT EMITTING ELEMENT, LIGHT EMITTING ASSEMBLY, DISPLAY DEVICE, AND METHOD FOR MAKING A LIGHT EMITTING ASSEMBLY

FIELD

The subject matter herein generally relates to a light emitting element, a light emitting assembly using the light emitting element, a display device using the light emitting assembly, and a method for making the light emitting assembly.

BACKGROUND

Using a light emitting diode (LED) emitting blue light, red and green phosphor powders can be excited to obtain red light and green light, respectively. Because a light-converting efficiency of green phosphor powder is lower than that of red phosphor powder, the green phosphor powder is generally formed on a surface of the LED emitting blue light, and the red phosphor powder is formed on the green phosphor powder. When the blue light emitted by the LED irradiates the green phosphor powder, a portion of the blue light is absorbed by the green phosphor powder and converted into green light. The unconverted blue light continued travels to the red phosphor powder, and a portion of the blue light unconverted is absorbed by the red phosphor and converted into red light. The red light, the green light, and the blue light that are unconverted are combined to form white light.

However, because energy of the green light is greater, a portion of the green light is absorbed by the particles in the red phosphor and converted into red light, resulting in a decrease in the conversion efficiency of the green light. Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

In one embodiment, a first phosphor layer and a second phosphor layer which do not overlap are included in one light emitting element. This is beneficial to reduce stray light generated by mixing of a first excited light and a second excited light, and improve a color purity of the first excited light and the second excited light. In addition, compared with a traditional method of laminating the first phosphor layer and the second phosphor layer together, the arrangement that the first phosphor layer and the second phosphor layer do not overlap with each other is beneficial to reduce the partial absorption of the second excited light by the first phosphor layer or the partial absorption of the first excited light by the second phosphor layer, thereby improving a light conversion efficiency of the first phosphor layer and the second phosphor layer.

First Embodiment

Figure 1:
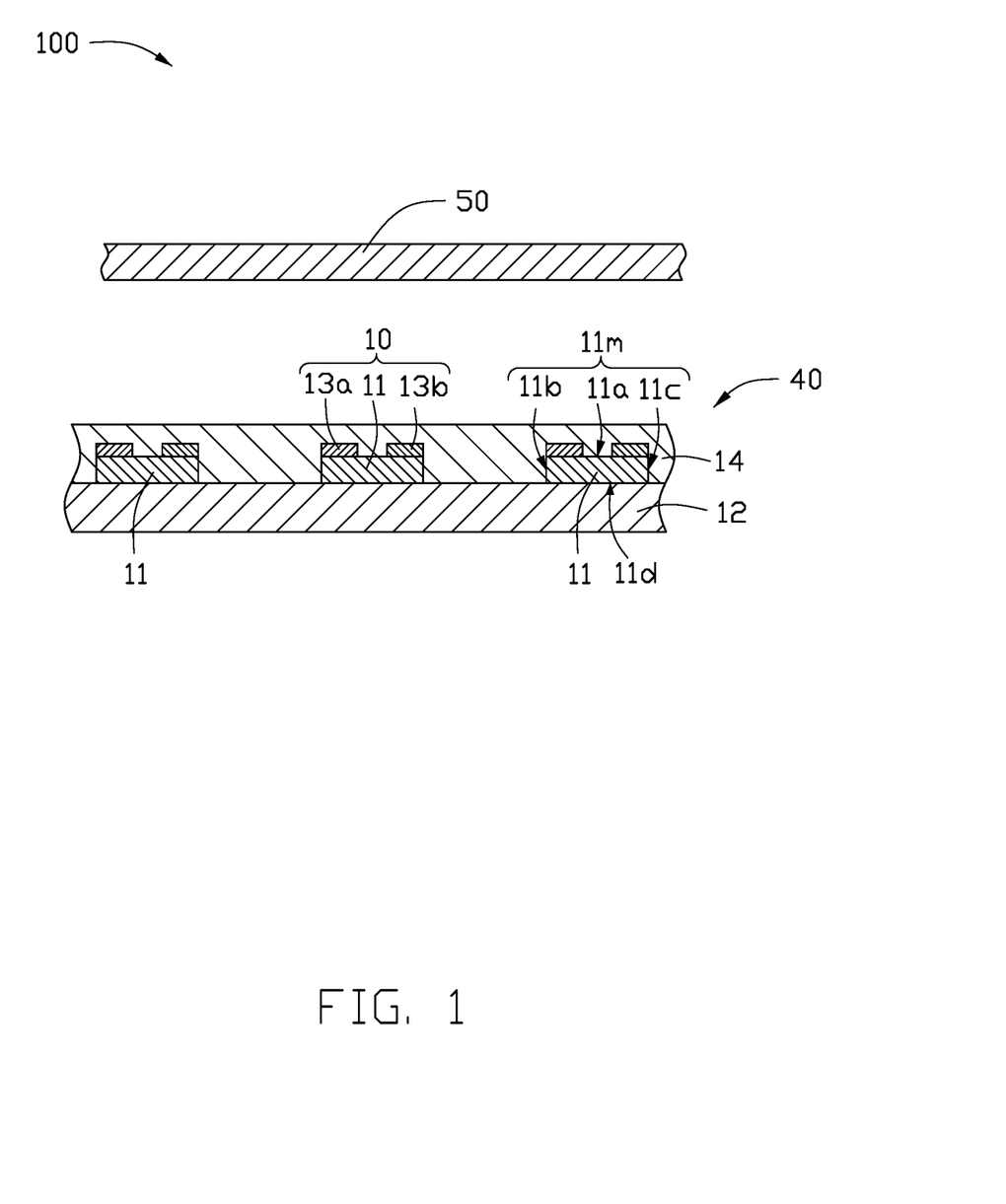
FIG. 1 is a cross-sectional view of a display device using a light emitting assembly according to a first embodiment.

FIG. 1 shows a display device 100 according to a first embodiment. The display device 100 includes a light emitting assembly 40 and display module 50 on an optical path of the light emitting assembly 40. The light emitting assembly 40 is configured to emit light to the display module 50 to display images. In one embodiment, the light emitting assembly 40 emits white light as light for the display, and the display module 50 is a liquid crystal display module, which can include an active matrix substrate, a color filter substrate, a liquid crystal layer between the active matrix substrate and the color filter substrate, a polarizer, and the like.

The light emitting assembly 40 includes a plurality of emitting elements 10 and a diffusion layer 14. The diffusion layer 14 is configured to encapsulate the light emitting elements 10 and diffuse the emitted light.

In one embodiment, the light emitting assembly 40 further includes a circuit board 12. The light emitting elements 10 are on the circuit board 12 and electrically connected to the circuit board 12. The diffusion layer 14 is also on the circuit board 12 and extends to at least partially cover the circuit board 12 to encapsulate the light emitting elements 10 on the circuit board 12. In one embodiment, the circuit board 12 is a printed circuit board (PCB), and a number of light emitting elements 10 in the light emitting assembly 40 can be set as required.

Each of the light emitting elements 10 includes a light emitting diode (LED) chip 11 configured to emit light. A first phosphor layer 13a is on a light emitting surface 11m of the LED chip 11 and is configured to emit a first excited light under irradiation of the light from LED chip 11. A second phosphor layer 13b is on the light emitting surface 11m of the LED chip 11 and does not overlap with the first phosphor layer 13a. The second phosphor layer 13b is configured to emit a second excited light under irradiation of the light. The second excited light has a color different from a color of the first excited light.

In one embodiment, a rectangular LED chip 11 is taken as an example. Each LED chip 11 includes a non-light emitting surface 11d adjacent to the circuit board 12, a first light emitting surface 11a opposite to the non-light emitting surface 11d, a second light emitting surface 11b connecting to the non-light emitting surface 11d and the first light emitting surface 11a, and a third light emitting surface 11c opposite to second light emitting surface 11b. That is, each LED chip 11 includes at least three light emitting surfaces 11m and one non-light emitting surface 11d.

In one embodiment, the first phosphor layer 13a and the second phosphor layer 13b are at least partially on the first light emitting surface 11a of the LED chip 11 and are spaced apart from each other. The second light emitting surface 11b, the third light emitting surface 11c and a portion of the first light emitting surface 11a are not covered by any phosphor layer. A portion of the light directly emitted from the light emitting surfaces 11m which are not covered by any phosphor layer thus does not pass through either the first phosphor layer 13a or the second phosphor layer 13b. The first excited light, the second excited light, and the light directly emitted are combined to form light for the display.

In one embodiment, the LED chip 11 emits blue excitation light. The first phosphor layer 13a is made of red phosphor powder, and the second phosphor layer 13b is made of green phosphor powder. The blue light emitted by the LED chip 11 excites and causes fluorescence in the first phosphor layer 13a and the second phosphor layer 13b, generating the first excited light and the second excited light, respectively. The blue light not absorbed by the first phosphor layer 13a and the second phosphor layer 13b combines with the red fluorescence and the green fluorescence combine to form white light for the display.

In other embodiments, the kind of the LED chip 11 and the materials of the first phosphor layer 13a and the second phosphor layer 13b may be selected according to the color of the light required for display. For example, the LED chip 11 may be an LED chip 11 that emits light of yellow, orange, purple, or the like. In one embodiment, the LED chip 11 may be a mini light emitting diode (Mini LED) chip which has a size of about one hundred microns to several hundred microns.

In one embodiment, a thickness of the first phosphor layer 13a is substantially equal to a thickness of the second phosphor layer 13b. An area of the first phosphor layer 13a irradiated by the light from LED chip 11 is defined as a first area, an area of the second phosphor layer 13b so irradiated is defined as a second area, and an area of the light emitting surfaces 11m of the LED chip minus the first area and the second area is defined as a third area.

That is, area of the first phosphor layer 13a receiving the light is defined as the first area, area of the second phosphor layer 13b receiving the light is defined as the second area, and an area of the light emitting surfaces 11m of the LED chip not covered by any phosphor layer is defined as the third area. In other words a sum of uncovered areas of the second, the third, and the first light emitting surfaces 11b, 11c, and 11a is defined as the third area.

In one embodiment, a ratio of luminous flux of the first excited light, the second excited light, and the light from LED chip 11 required to form the light for display is equal to a ratio of a product of the first area and a light conversion efficiency of the first phosphor layer, a product of the second area and a light conversion efficiency of the second phosphor layer, and the third area.

In one embodiment, the ratio of luminous flux of first excited light (red light), the second excited light (green light), and the chip 11 light (blue light) required to form the illumination light (white light) is equal to 3:6:1. The first area, the second area, and the total area of the light emitting surfaces 11m are represented by X, Y, and Z, respectively. The light conversion efficiency of the first phosphor layer (red phosphor powder) 13a and the light conversion efficiency of the second phosphor layer (green phosphor powder) 13b are represented by a and b, respectively. Then, the third area is equal to (Z-X-Y), and X×a:Y×b: 1×(Z-X-Y) is equal to 3:6:1.

In other words, according to the light conversion efficiency a of the first phosphor and the light conversion efficiency b of the second phosphor, the first area X and the second area Y can be adjusted to obtain a better mix of light. In one embodiment, the first phosphor layer 13a and the second phosphor layer 13b are only formed on the first light emitting surface 11a of the LED chip 11, the first area X is an area of the first phosphor layer 13a covering the first light emitting surface 11a, and the second area Y is an area of the second phosphor layer 13b covering the first light emitting surface 11a.

Figure 2:
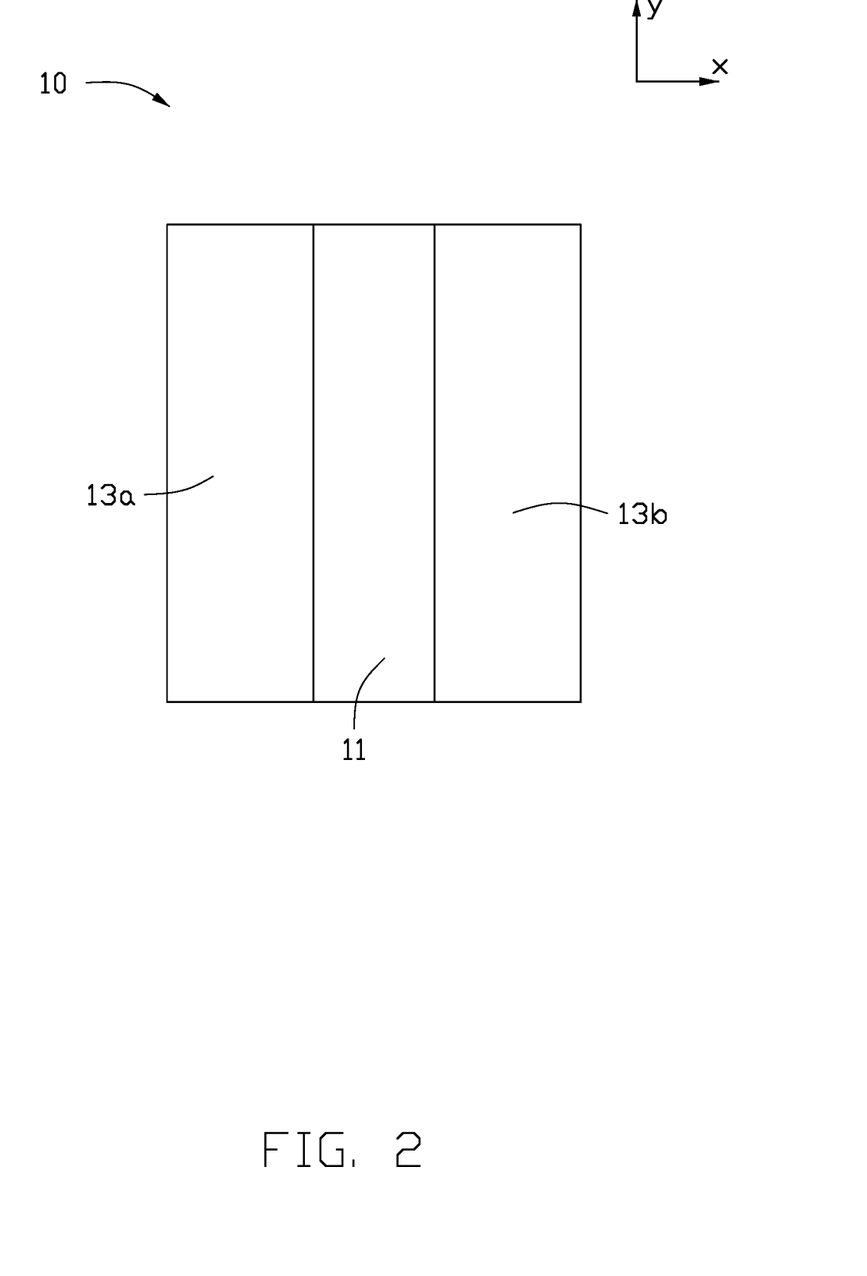
FIG. 2 is a view from below of the light emitting element of FIG. 1.

As shown in FIG. 2, the widths of the first phosphor layer 13a, the second phosphor layer 13b, and the LED chip 11 in the y-axis are the same. According to the X×a:Y×b:1×(Z-X-Y) is equal to 3:6:1. The height of the LED chip 11 perpendicular to the plane of the x-axis and the y-axis, and a proportional relationship between the widths of the first phosphor layer 13a, the second phosphor layer 13b, and the light-emitting diode chip 11 in the x-axis can be obtained. That is, according to the light conversion efficiency a of the first phosphor and the light conversion efficiency b of the second phosphor, the widths of the first phosphor layer 13a and the second phosphor layer 13b in the x direction can be adjusted to obtain better light mix.

In other embodiments, the shapes of the LED chip 11, of the first phosphor layer 13a, and of the second phosphor layer 13b can be designed as required, for example, the shapes of the LED chip 11, the first phosphor layer 13a, and the second phosphor layer 13b may be circular, diamondshaped, irregularly shaped, or the like. The shapes of the LED chip 11, the first phosphor layer 13a, and the second phosphor layer 13b may be the same or different. The first phosphor layer 13a and the second phosphor layer 13b may be continuously deposited on the LED chip 11 or may be deposited at intervals.

Figure 3:
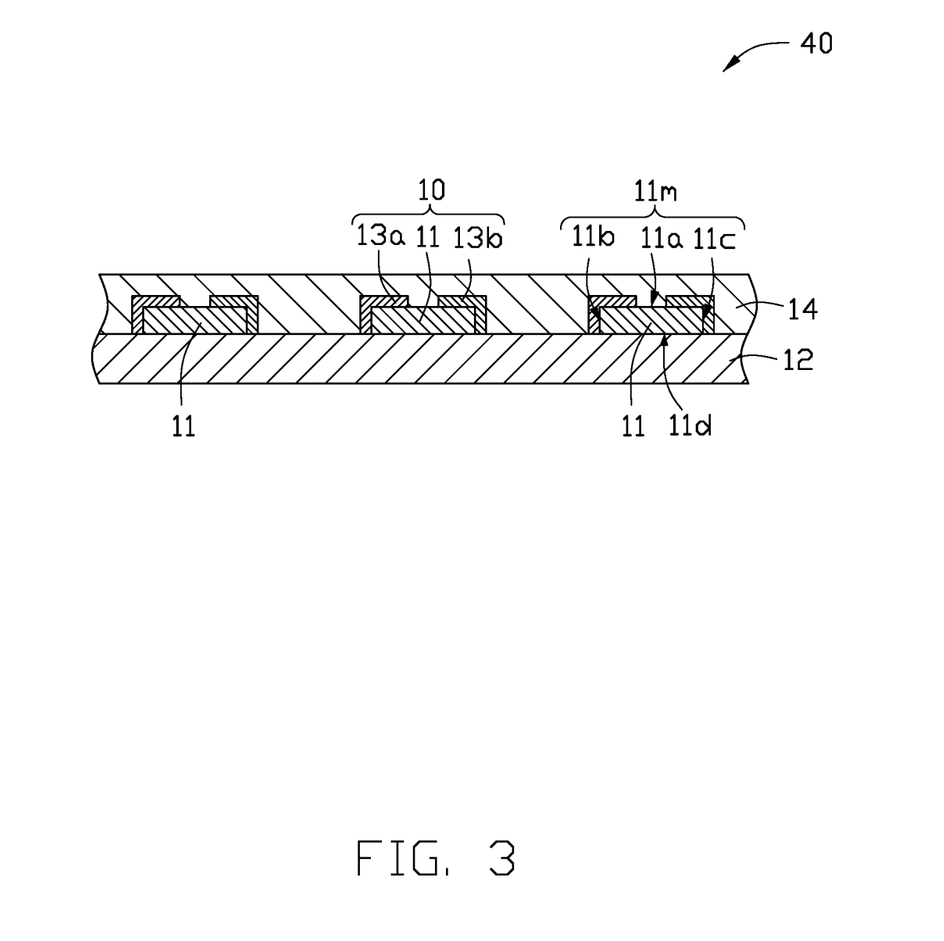
FIG. 3 is a cross-sectional view of a light emitting assembly according to another embodiment.

In another embodiment, as shown in FIG. 3, the first phosphor layer 13a partially covers the first light emitting surface 11a of one LED chip 11 and extends from the first light emitting surface 11a of the one LED chip 11 to the second light emitting surface 11b of the one LED chip 11. The second phosphor layer 13b partially covers the first light emitting surface 11a of one LED chip 11 and extends from the first light emitting surface 11a of the one LED chip 11 to the third light emitting surface 11c of the one LED chip 11. The first phosphor layer 13a and the second phosphor layer 13b are spaced apart from each other on the first light emitting surface 11a of the one LED chip 11.

Excitation light (blue light) emitted from the side surfaces (second, third light emitting surfaces 11b and 11c) of the light emitting diode chip 11 can excite the first phosphor layer 13a and the second phosphor layer 13b, respectively. Therefore, the areas where the first phosphor layer 13a and the second phosphor layer 13b receive the excitation light directly emitted by the LED chip 11 are increased, which is favorable for improving the large viewing angle color shift phenomenon of the display device 100.

In one embodiment, the first phosphor layer 13a and the second phosphor layer 13b are formed on the light emitting surface 11m by physical vapor deposition (PVD) method. Compared with the traditional gel coating method, the first phosphor layer 13a and the second phosphor layer 13b formed by PVD have higher density, so that gaps between particles of red phosphor powder and gaps between particles of green phosphor powder are smaller, and the wavelength conversion efficiency of the first phosphor layer 13a and the second phosphor layer 13b are improved.

Traditionally, the red phosphor layer and the green phosphor layer are laminated, and the red phosphor powder and the green phosphor powder are mixed with each other, resulting in the converted light interacting to emit redundant stray light. In the present disclosure, the red phosphor layer and the green phosphor layer do not overlap, which is beneficial to reduce stray light generated by a mixture of red fluorescence and green fluorescence, obtaining high-purity red light and high-purity green light for mixing with the blue chip 11 light. Thus, the cross-interference of red light and green light on each other is reduced, and a high-purity RGB spectrum is obtained. On the other hand, the absorption of green light by the red phosphor layer is reduced and the light conversion efficiency of green light is improved. The light emitting assembly 40 may be used in a display device using LEDs as a backlighting source, or in any lighting device using LEDs as a light source.

A method for making the lighting assembly 40 is also provided. The method is provided by way of embodiment, as there are a variety of ways to carry out the method. The method described below can be carried out using the configurations illustrated in FIGS. 4A and 4B for example, and various elements of these figures are referenced in explaining the method. Each block in this method represents one or more processes, methods, or subroutines, carried out in the method. Additionally, the illustrated order of blocks is by example only and the order of the blocks can change. The method can begin at Block S11.

Figure 4A:
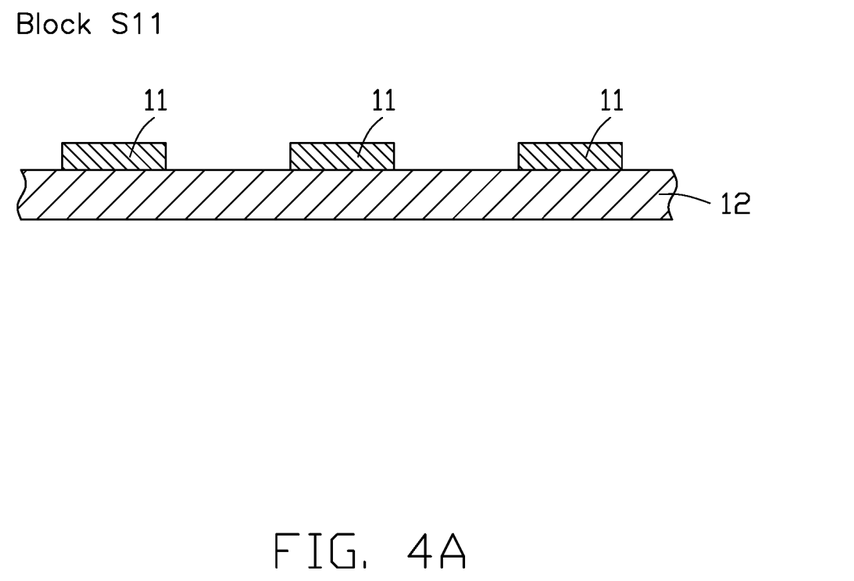
FIG. 4A is a cross-sectional view illustrating an embodiment of a method for making the light emitting assembly of FIG. 1 at a process Block S11.

Block S11: as shown in FIG. 4A, a plurality of LED chips 11 is provided on the circuit board (PCB) 12. The LED chips 11 are electrically connected to the circuit board 12.

Figure 4B:
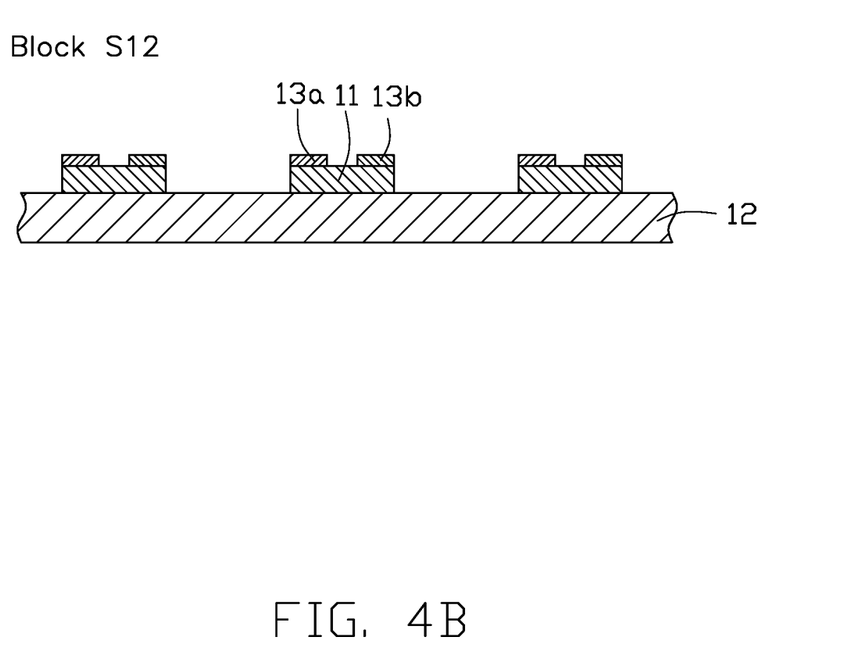
FIG. 4B is a cross-sectional view illustrating the method for making the light emitting assembly of FIG. 1 at a process Block S12.

Block S12: as shown in FIG. 4B, a first primary color phosphor layer (a red phosphor power, such as a KSF system red phosphor power) and a second primary phosphor layer (a green phosphor, such as β-SiAlON) are formed on the light emitting surface 11m of each of the LED chips 11 by PVD, and the first phosphor layer 13a and the second phosphor layer 13b which do not overlap are obtained.

Block S13: a diffusion layer 14 is formed to encapsulate the LED chips 11, the first phosphor layer 13a and the second phosphor layer 13b on the circuit board 12, and the light emitting assembly 40 as shown in FIG. 1 is obtained.

In another embodiment, another method for making the lighting assembly 40 is provided. The method is provided by way of embodiment, as there are a variety of ways to carry out the method. The method described below can be carried out using the configurations illustrated in FIGS. 5A to 5C for example, and various elements of these figures are referenced in explaining the method. Each block in this method represents one or more processes, methods, or subroutines, carried out in the method. Additionally, the illustrated order of blocks is by example only and the order of the blocks can change. The method can begin at Block S21.

Figure 5A:
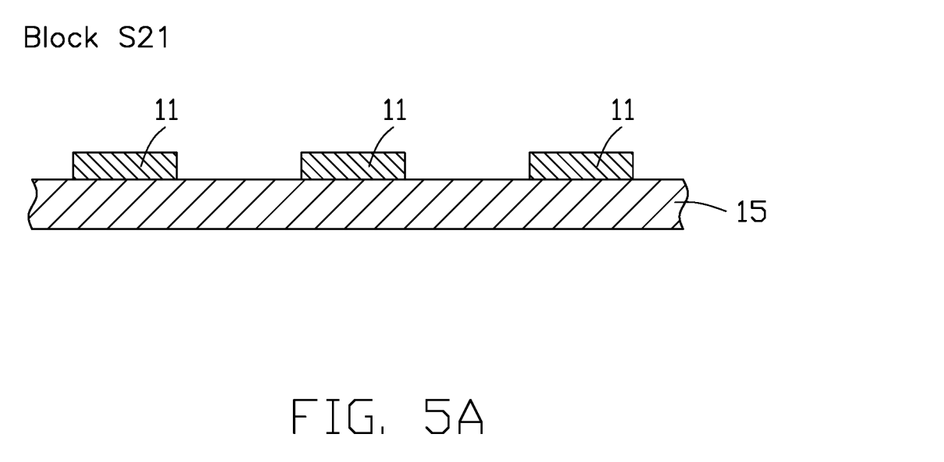
FIG. 5A is a cross-sectional view illustrating another embodiment of a method for making the light emitting assembly of FIG. 1 at a process Block S21.
Figure 5B:
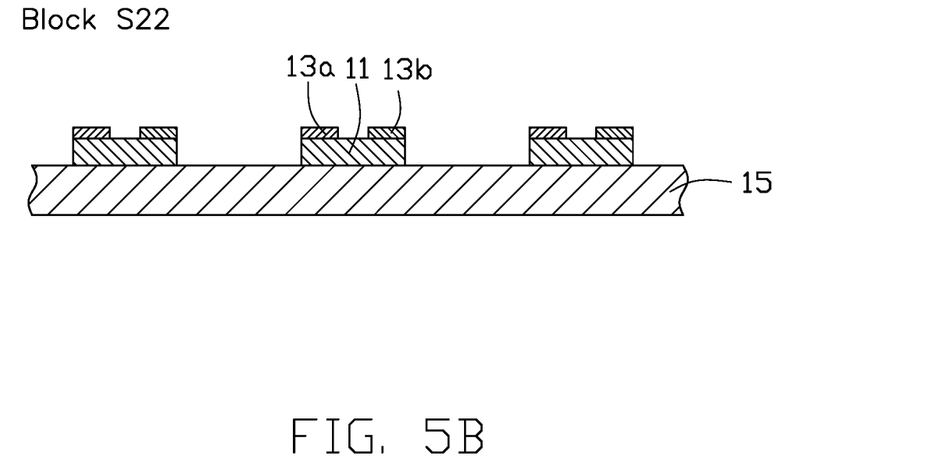
FIG. 5B is a cross-sectional view illustrating the method for making the light emitting assembly of FIG. 1 at a process Block S22.

Block S21: as shown in FIG. 5A, a carrier substrate 15 with a plurality of LED chips 11 is provided. Block S22: as shown in FIG. 5B, a first primary color phosphor layer and a second primary phosphor layer are formed on the light emitting surface 11m of each of the LED chips 11 by PVD, and the first phosphor layer 13a and the second phosphor layer 13b which do not overlap are obtained.

In one embodiment, the carrier substrate 15 is a LED chip substrate (e.g., a silicon substrate).

Figure 5C:
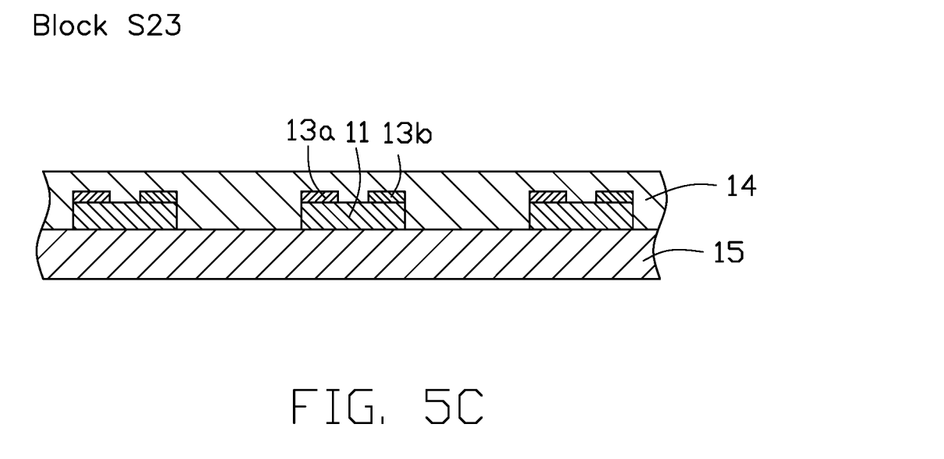
FIG. 5C is a cross-sectional view illustrating the method for making the light emitting assembly of FIG. 1 at a process Block S23.

Block S23: as shown in FIG. 5C, a diffusion layer 14 is formed to encapsulate the LED chip 11, the first phosphor layer 13a, and the second phosphor layer 13b on the carrier substrate 15.

Block S24: the diffusion layer 14 along with the LED chips 11, the first phosphor layer 13a and the second phosphor layer 13b are transferred from the carrier substrate 15 to a circuit board 12.

In one embodiment, after the diffusion layer 14 together with the LED chips 11, the first phosphor layer 13a and the second phosphor layer 13b are peeled off from the carrier sheet 15, a plurality of LED chip assemblies encapsulated by the diffusion layer 14 are formed by cutting between each two LED chips 11, and the LED chip assemblies are adhered to the circuit board 12 spaced from each other.

Second Embodiment

Figure 6:
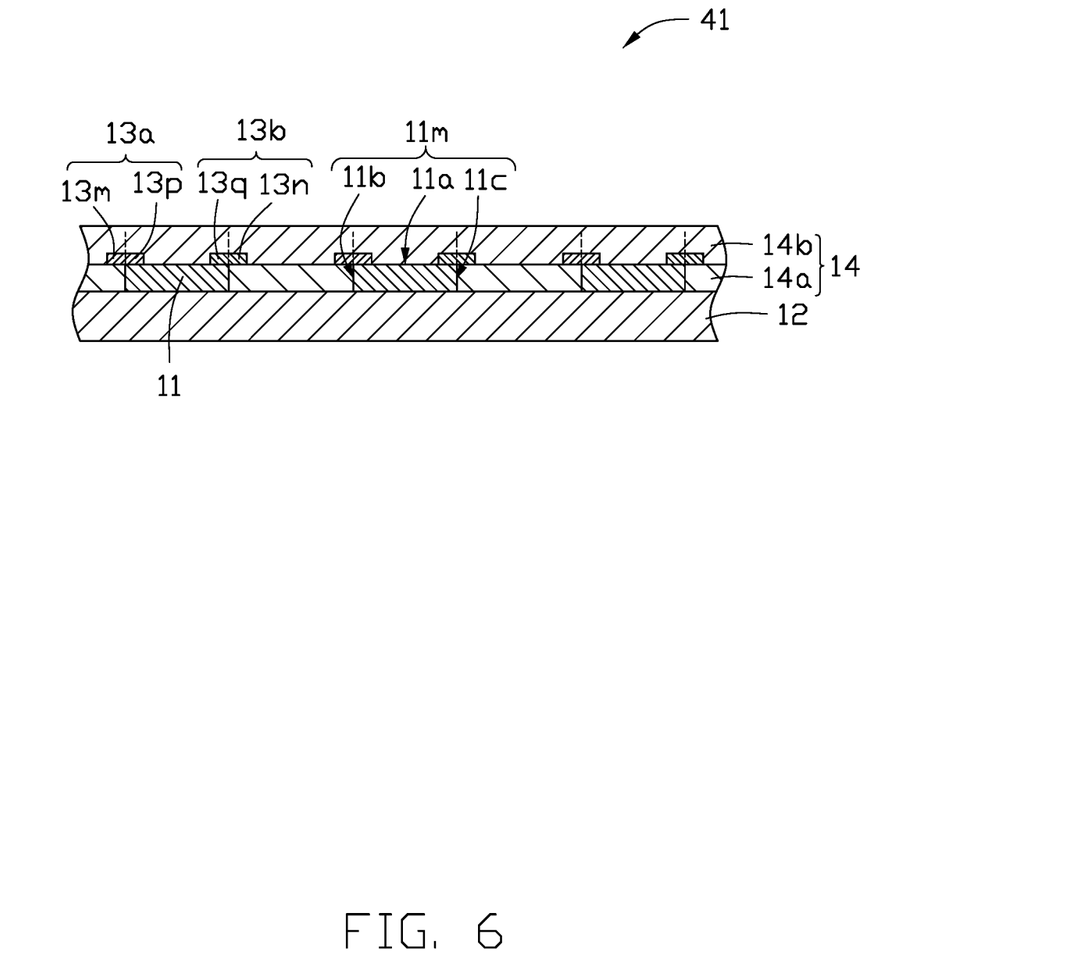
FIG. 6 is a cross-sectional of a light emitting assembly according to a second embodiment.

As shown in FIG. 6, the light emitting assembly 41 of the second embodiment differs from the light emitting assembly 40 of the first embodiment in that the diffusion layer 14 includes a first diffusion layer 14a and a second diffusion layer 14b. The first diffusion layer 14a is in an area of the circuit board 12 not covered by the LED chip 11. The LED chips 11 are embedded in the first diffusion layer 14a. The second diffusion layer 14b covers the first diffusion layer 14a and the light emitting element 10. The surface of the first diffusion layer 14a away from the circuit board 12 is substantially flush with the first light emitting surface 11a of the LED chip 11. That is, the surface of the first diffusion layer 14a away from the circuit board 12 is substantially coplanar with the first light emitting surface 11a of the LED chip 11.

The first phosphor layer 13a includes a first main portion 13p and a first extension portion 13m. The first main portion 13p partially covers the first light emitting surface 11a of the LED chip 11. The first extension portion 13m extends from the first main portion 13p and beyond the first light emitting surface 11a of the LED chip 11 to partially cover the first diffusion layer 14a. The second phosphor layer 13b includes a second main portion 13q and a second extension portion 13n. The second main portion 13q partially covers the first light emitting surface 11a of the LED chip 11. The second extension portion 13n extends from the second main portion 13q and beyond the first light emitting surface 11a of the LED chip 11 to partially cover the first diffusion layer 14a. That is, the first extension portion 13m and the second extension portion 13n extend beyond the first light emitting surface 11a of the LED chip 11 to the first diffusion layer 14a. The second diffusion layer 14b includes optical diffusion particles, which can further improve the uniformity of the light emitted from the light emitting assembly 41.

In one embodiment, a method for making the lighting assembly 41 is provided. The method is provided by way of embodiment, as there are a variety of ways to carry out the method. The method described below can be carried out using the configurations illustrated in FIGS. 4A, 7A and 4B for example, and various elements of these figures are referenced in explaining the method. Each block in this method represents one or more processes, methods, or subroutines, carried out in the method. Additionally, the illustrated order of blocks is by example only and the order of the blocks can change. The method can begin at Block S31.

Block S31: as shown in FIG. 4A, a plurality of LED chips 11 is provided on the circuit board (PCB) 12. The LED chips 11 are electrically connected to the circuit board 12.

Figure 7A:
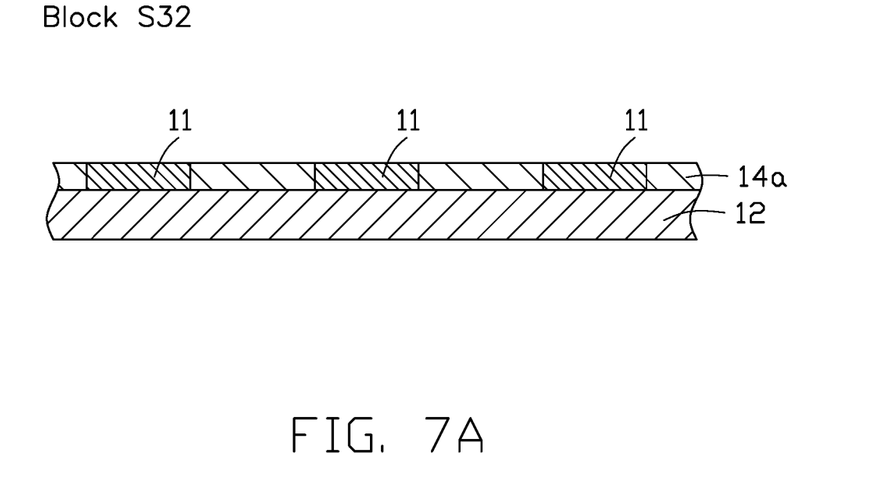
FIG. 7A is a cross-sectional view illustrating an embodiment of a method for making the light emitting assembly of FIG. 6 at a process Block S32.

Block S32: as shown in FIG. 7A, a first diffusion layer 14a is formed on a surface of the circuit board 12, and the LED chips 11 are embedded in the first diffusion layer 14a, and a surface of the first diffusion layer 14a away from the circuit board 12 is substantially coplanar with a surface of each of the LED chips 11 away from the circuit board 12.

Figure 7B:
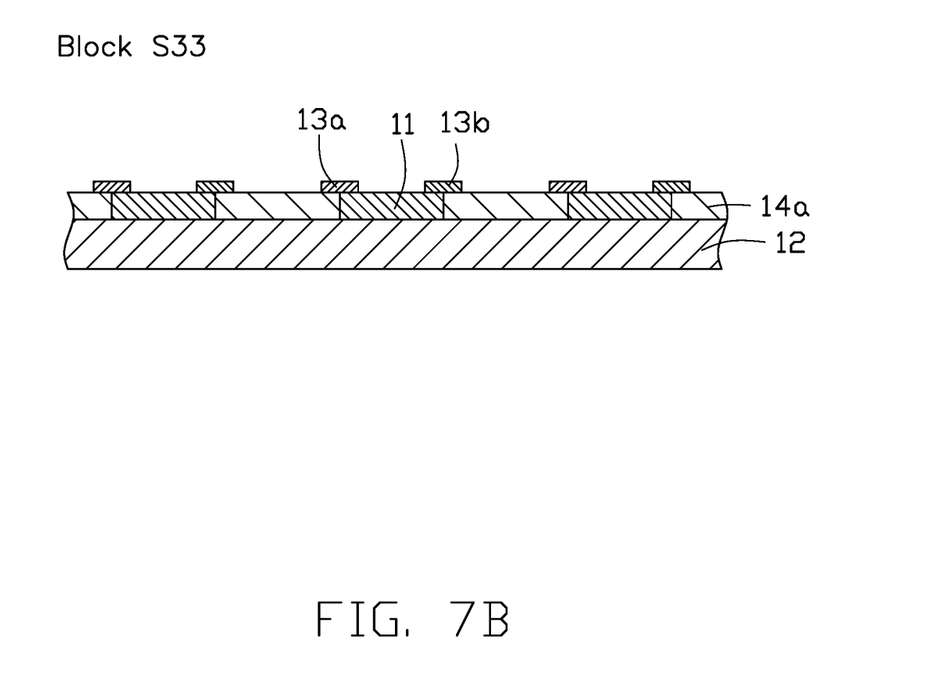
FIG. 7B is a cross-sectional view illustrating the method for making the light emitting assembly of FIG. 6 at a process Block S33.

Block S33: as shown in FIG. 7B, a first phosphor layer 13a and a second phosphor layer 13b are formed on the LED chips 11 and the first diffusion layer 14a by PVD, wherein the first phosphor layer 13a partially covers one LED chip 11 and the first diffusion layer 14a; the second phosphor layer 13b partially covers one LED chip 11 and the first diffusion layer 14a.

Block S34: a second diffusion layer 14b is formed to encapsulate the first diffusion layer 14a, the first phosphor layer 13a, the second phosphor layer 13b and the LED chips 11 on the circuit board 12, and the light emitting assembly 41 as shown in FIG. 6 is obtained.

Generally, the first phosphor layer 13a and the second phosphor layer 13b deposited by PVD method at surface junctions (especially at corners) of each LED chip 11 are relatively thin, blue light is easy to exit from the large viewing angle direction (i. e., shielding effect). In the light emitting module 41, the surface of the first diffusion layer 14a away from the circuit board 12 and the surface of each of the LED chips 11 away from the circuit board 12 are substantially flush. That is, the deposition surfaces of the first phosphor layer 13a and the second phosphor layer 13b are planar, so that the thickness of the first phosphor layer 13a and the second phosphor layer 13b are uniform, thereby reducing the influence of shielding effect, improving the large viewing angle color shift of the display device 100, and improving the display quality of the picture.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A light emitting element, comprising:
   a light emitting diode (LED) chip configured to emit excitation light, the LED chip comprising a light emitting surface;
   a first phosphor layer, at least part of the first phosphor layer being on the light emitting surface, the first phosphor layer being configured to emit a first excited light under irradiation of the excitation light;
   a second phosphor layer, at least part of the second phosphor layer being on the light emitting surface and not overlapping with the first phosphor layer, the second phosphor layer being configured to emit a second excited light under irradiation of the excitation light, a color of the second excited light being different from a color of the first excited light, wherein the light emitting element is configure to combine the first excited light, the second excited light, and a portion of the excitation light to emit illumination light;
   wherein a thickness of the first phosphor layer is equal to a thickness of the second phosphor layer;
   an area of the first phosphor layer irradiated by the excitation light is defined as a first area;
   an area of the second phosphor layer irradiated by the excitation light is defined as a second area;
   an area of the light emitting surface of the LED chip not covered by any phosphor layer is defined as a third area; and
   a ratio of luminous flux of the first excited light, the second excited light, and the excitation light forming the illumination light is equal to a ratio of a product of the first area and a light conversion efficiency of the first phosphor layer, a product of the second area and a light conversion efficiency of the second phosphor layer, and the third area.

2. A light emitting assembly, comprising at least one light emitting element and a diffusion layer covering the at least one light emitting element, each of the at least one light emitting element comprising:
   a light emitting diode (LED) chip configured to emit excitation light, the LED chip comprising a light emitting surface;
   a first phosphor layer, at least part of the first phosphor layer being on the light emitting surface, the first phosphor layer being configured to emit a first excited light under irradiation of the excitation light;
   a second phosphor layer, at least part of the second phosphor layer being on the light emitting surface and not overlapping with the first phosphor layer, the second phosphor layer being configured to emit a second excited light under irradiation of the excitation light, a color of the second excited light being different from a color of the first excited light, wherein:
   the light emitting element is configured to combine the first excited light, the second excited light and a portion of the excitation light to emit illumination light, and the diffusion layer is configured to encapsulate the at least one light emitting element and diffuse the illumination light;

wherein a thickness of the first phosphor layer is equal to a thickness of the second phosphor layer;

an area of the first phosphor layer irradiated by the excitation light is defined as a first area;

an area of the second phosphor layer irradiated by the excitation light is defined as a second area;

an area of the light emitting surface of the LED chip not covered by any phosphor layer is defined as a third area; and a ratio of luminous flux of the first excited light, the second excited light, and the excitation light forming the illumination light is equal to a ratio of a product of the first area and a light conversion efficiency of the first phosphor layer, a product of the second area and a light conversion rate of the second phosphor layer, and the third area.

3. The light emitting assembly according to claim 2, further comprising a circuit board, the at least one light emitting element being electrically connected to the circuit board, the diffusion layer extending to at least partially cover the circuit board to encapsulate the at least one light emitting element on the circuit board.

4. The light emitting assembly according to claim 3, wherein in each of the at least one light emitting element, the LED chip comprises:
 a non-light emitting surface adjacent to the circuit board,
 a first light emitting surface opposite to the non-light emitting surface,
 a second light emitting surface connecting to each of the non-light emitting surface and the first light emitting surface, and
 a third light emitting surface opposite to second light emitting surface;
 the first phosphor layer and the second phosphor layer are at least partially on the first light emitting surface of the LED chip and are spaced apart from each other.

5. The light emitting assembly according to claim 4, wherein the first phosphor layer extends from the first light emitting surface of the LED chip to the second light emitting surface of the LED chip; the second phosphor layer extends from the first light emitting surface of the LED chip to the third light emitting surface of the LED chip.

6. The light emitting assembly according to claim 4, wherein the diffusion layer comprises a first diffusion layer and a second diffusion layer;
 the first diffusion layer is on the circuit board, the LED chip is embedded in the first diffusion layer;
 the first phosphor layer extends beyond the first light emitting surface of the LED chip and covers the first diffusion layer;
 the second phosphor layer extends beyond the first light emitting surface of the LED chip and covers the first diffusion layer;
 the second diffusion layer covers the first phosphor layer, the second phosphor layer, the LED chip and the first diffusion layer.

7. A display device, comprising a light emitting assembly and a display module on an optical path of the light emitting assembly, the light emitting assembly being configured to emit illumination light to the display module to display images; the light emitting assembly comprising at least one light emitting element and a diffusion layer covering the at least one light emitting element, each of the at least one light emitting element comprising:

a light emitting diode (LED) chip configured to emit excitation light, the LED chip comprising a light emitting surface;

a first phosphor layer, at least part of the first phosphor layer being on the light emitting surface, the first phosphor layer being configured to emit a first excited light under irradiation of the excitation light;

a second phosphor layer, at least part of the second phosphor layer being on the light emitting surface and not overlapping with the first phosphor layer, the second phosphor layer being configured to emit a second excited light under irradiation of the excitation light, a color of the second excited light being different from a color of the first excited light, wherein:

the light emitting element is configured to combine the first excited light, the second excited light and a portion of the excitation light to emit the illumination light; and the diffusion layer is configured to encapsulate the at least one light emitting element and diffuse the illumination light;

wherein a thickness of the first phosphor layer is equal to a thickness of the second phosphor layer;

an area of the first phosphor layer irradiated by the excitation light is defined as a first area;

an area of the second phosphor layer irradiated by the excitation light is defined as a second area;

an area of the light emitting surface of the LED chip not covered by any phosphor layer is defined as a third area; and a ratio of luminous flux of the first excited light, the second excited light, and the excitation light forming the illumination light is equal to a ratio of a product of the first area and a light conversion efficiency of the first phosphor layer, a product of the second area and a light conversion efficiency of the second phosphor layer, and the third area.

8. The display device according to claim 7, further comprising a circuit board, the at least one light emitting element being electrically connected to the circuit board, the diffusion layer extending to at least partially cover the circuit board to encapsulate the at least one light emitting element on the circuit board.

9. The display device according to claim 8, wherein in each of the at least one light emitting element, the LED chip comprises:
 a non-light emitting surface adjacent to the circuit board,
 a first light emitting surface opposite to the non-light emitting surface,
 a second light emitting surface connecting each of the non-light emitting surface and the first light emitting surface, and
 a third light emitting surface opposite to second light emitting surface;
 the first phosphor layer and the second phosphor layer are at least partially on the first light emitting surface of the LED chip and are spaced apart from each other.

10. The display device according to claim 9, wherein the first phosphor layer extends from the first light emitting surface of the LED chip to the second light emitting surface of the LED chip; the second phosphor layer extends from the first light emitting surface of the LED chip to the third light emitting surface of the LED chip.

11. The display device according to claim 9, wherein the diffusion layer comprises a first diffusion layer and a second diffusion layer;
 the first diffusion layer is on a surface of the circuit board, the LED chip is embedded in the first diffusion layer, and a surface of the first diffusion layer away from the circuit board is coplanar with the first light emitting surface of the LED chip;

the first phosphor layer extends beyond the first light emitting surface of the LED chip and covers the first diffusion layer;

the second phosphor layer extends beyond the first light emitting surface of the LED chip and covers the first diffusion layer;

the second diffusion layer covers the first phosphor layer, the second phosphor layer, the LED chip and the first diffusion layer.

12. A method for making a light emitting assembly, comprising:

providing at least one light emitting diode (LED) chip;

forming a first primary color phosphor layer and a second primary color phosphor layer on the light emitting surface of each of the at least one LED chip; arranging the second primary color phosphor layer not overlapping with the first primary color phosphor layer; and forming a diffusion layer to encapsulate the first primary color phosphor layer, the second primary color phosphor layer and the at least one LED chip;

wherein providing the at least one LED chip comprises providing a carrier substrate with the at least one LED chip, and the method for making the light emitting assembly further comprises transferring the first primary color phosphor layer, the second primary color phosphor layer, the at least one LED chip and the diffusion layer from the carrier substrate to a circuit board.

13. The method for making the light emitting assembly according to claim 12, wherein providing the at least one LED chip comprises electrically connecting each of the at least one LED chip to a circuit board.

14. The method for making the light emitting assembly according to claim 13, before forming the first primary color phosphor layer and the second primary color phosphor layer, further comprising:

forming a first diffusion layer on a surface of the circuit board, and embedding the at least one LED chip in the first diffusion layer, wherein a surface of the first diffusion layer away from the circuit board is coplanar with a surface of each of the at least one LED chip away from the circuit board;

partially covering one of the at least one LED chip and the first diffusion layer with the first phosphor layer;

partially covering one of the at least one LED chip and the first diffusion layer with the second phosphor layer.

15. The method for making the light emitting assembly according to claim 14, wherein forming the first primary color phosphor layer and the second primary color phosphor layer is carried out by physical vapor deposition.

* * * * *